(12) United States Patent
Pickett et al.

(10) Patent No.: US 8,274,813 B2
(45) Date of Patent: Sep. 25, 2012

(54) MEMRISTIVE NEGATIVE DIFFERENTIAL RESISTANCE DEVICE

(75) Inventors: Matthew D. Pickett, San Francisco, CA (US); Julien Borghetti, Mountain View, CA (US); Gilberto Medeiros Ribeiro, Menlo Park, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 182 days.

(21) Appl. No.: 12/837,903

(22) Filed: Jul. 16, 2010

(65) Prior Publication Data

US 2012/0014161 A1    Jan. 19, 2012

(51) Int. Cl.
*G11C 11/00* (2006.01)

(52) U.S. Cl. ......... 365/148; 365/100; 365/129; 257/4; 257/5; 977/754

(58) Field of Classification Search ........... 365/46, 365/94, 100, 113, 129, 148, 163; 257/2–5, 257/9, 296, 310, E21.35, E31.047, E27.006; 438/29, 95, 96, 166, 135, 240, 259, 365; 438/482, 486, 597, 785; 977/754
See application file for complete search history.

(56) References Cited

U.S. PATENT DOCUMENTS

| 7,985,962 | B2 * | 7/2011 | Bratkovski et al. | 257/4 |
| 8,113,437 | B2 * | 2/2012 | Kang | 235/492 |
| 2010/0084627 | A1 | 4/2010 | Berger et al. | |
| 2011/0147464 | A1 * | 6/2011 | Kang | 235/492 |
| 2011/0182107 | A1 * | 7/2011 | Wu et al. | 365/148 |
| 2011/0182108 | A1 * | 7/2011 | Williams et al. | 365/148 |
| 2011/0266515 | A1 * | 11/2011 | Pickett et al. | 257/5 |

OTHER PUBLICATIONS

Sun, Weiheng, et al.; "A Memristor Based Chaotic Oscillator"; IEEE; Jul. 23-25, 2009; pp. 955-957.
Muthuswamy, Bharathwaj; "Memristor Based Chaotic Circuits"; IETE Technical Review; vol. 26; Issue 6; Nov.-Dec. 2009.
Itoh, Makoto, et al.; "Memristor Oscillators"; International Journal of Bifurcation and Chaos, vol. 18, No. 11; 2008; pp. 3183-3206; World Scientific Publishing Company.
Pershin, Yuriy V., et al.; "Practical Approach to Programmable Analog Circuits with Memristors"; Aug. 2009.

* cited by examiner

*Primary Examiner* — Richard Elms
*Assistant Examiner* — Harry W Byrne (57) ABSTRACT

A memristive Negative Differential Resistance (NDR) device includes a first electrode adjacent to a memristive matrix, the memristive matrix including an intrinsic semiconducting region and a highly doped secondary region, a Metal-Insulator-Transition (MIT) material in series with the memristive matrix, and a second electrode adjacent to the MIT material.

16 Claims, 10 Drawing Sheets

Connect a first electrode to a memristive matrix, the memristive matrix comprising an intrinsic semiconducting region and a highly doped secondary region
(block 802)

Connect the memristive matrix in series to a Metal-Insulator-Transition (MIT) material
(block 804)

Connect the MIT material to a second electrode
(block 806)

*Fig. 8*

MEMRISTIVE NEGATIVE DIFFERENTIAL RESISTANCE DEVICE

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

Some electronic devices such as diodes have been shown to exhibit a property referred to as Negative Differential Resistance (NDR). A device which exhibits NDR will experience a decrease in voltage with a rise in electric current at certain current levels. This is opposed to standard electronic devices which always experience an increase in voltage with an increase in current. A device which exhibits NDR can be used in a wide range of practical applications. One such application is an oscillator circuit.

An oscillator circuit is an electronic circuit which outputs a repetitive electronic signal. Oscillator circuits are used in a wide range of electronic circuit applications such as radio transmitters and clock signals. Oscillator circuits can be constructed through a variety of different methods. One type of oscillator circuit can be constructed using a device which exhibits NDR. Particularly, by applying a particular bias voltage to a device exhibiting NDR, an oscillating signal can be produced. Oscillator circuits which make use of NDR devices typically use devices such as tunnel diodes. However, such diode devices are static. Static devices cannot change their properties. Many electronic applications utilize various oscillating signals having different properties. To produce these different oscillating signals, many different oscillator circuits using different diode devices with different properties must be used.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

As mentioned above, an oscillator circuit is an electronic circuit which outputs a repetitive electronic signal. Oscillator circuits are used in a wide range of electronic circuit applications such as radio transmitters and clock signals. Oscillator circuits can be constructed through a variety of different methods. One type of oscillator circuit can be constructed using a device which exhibits NDR. Particularly, by applying a particular bias voltage to a device exhibiting NDR, an oscillating signal can be produced. Oscillator circuits which make use of NDR devices typically use devices such as tunnel diodes. However, such diode devices are static. Static devices cannot change their properties. Many electronic applications utilize various oscillating signals having different properties. To produce these different oscillating signals, many different oscillator circuits using different diode devices with different properties must be used.

In light of this and other issues, the present specification discloses a memristive device which can exhibit NDR. A memristive device is able to change its resistive state with the application of a programming voltage. Additionally, memristive devices are non-volatile. As such, a memristive device will maintain its resistive state whether or not power is being supplied to the memristive device. Changing the resistive state of a memristive device which exhibits NDR will also change the NDR characteristics of the device. By changing the NDR properties of the memristive device, oscillating signals having different properties can be produced by an oscillating circuit utilizing a memristive device exhibiting NDR. These different properties of an oscillating signal may include, among others, oscillation frequency, amplitude, and duty cycle.

According to certain illustrative embodiments, the memristive NDR device includes a memristive matrix in series with a Metal-Insulator Transition (MIT) material such as vanadium oxide. The memristive matrix includes an intrinsic semi-conducting region and a highly doped region. More detail on the principles and operation of the memristive matrix will be described below. The MIT material gives the device NDR properties. More detail on the MIT material will also be given below.

As mentioned above, one use of a memristive NDR device embodying principles described herein is an oscillator circuit. To use such a memristive NDR device in an oscillator circuit, a bias voltage is applied across the memristive NDR device. A capacitance is made to exist in parallel with the memristive device. Thus, the voltage across the memristive NDR device will be coupled to the voltage across the capacitance. This capacitance can either result from an intentionally added capacitive component, or a parasitic capacitance. The parasitic capacitance may result from the device itself or the metal wires leading to the device. At particular applied bias voltage levels, the capacitance will continually charge and discharge. This will create an oscillating voltage level across the capacitance. A more detailed discussion of the oscillation will be discussed below.

If a programming voltage is applied to the memristive NDR device, the memristive NDR device will change its resistive state. The programming voltage is larger than a threshold voltage. Voltage levels lower than the threshold voltage are used for operation of the oscillator circuit. At a different memristive state, the applied bias voltage will produce a different oscillating voltage level across the capacitance. Thus, the memristive oscillator circuit can be reconfigured to produce oscillating signals having different properties.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1A:
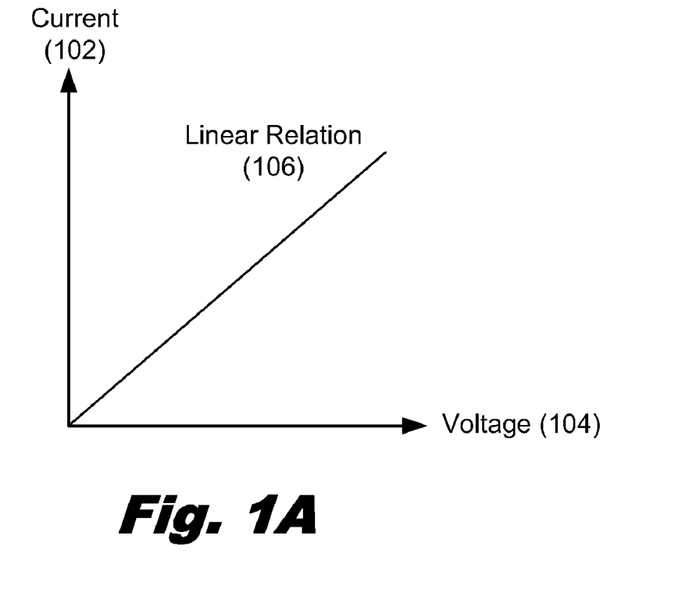
FIGS. 1A-1D are diagrams showing different types of current-to-voltage relationships, according to one example of principles described herein.

Referring now to the figures, FIGS. 1A-1D are diagrams showing current-to-voltage relationships of different types of devices. The vertical axes of the graphs represent electric current (102) and the horizontal axes of the graphs represent voltage (104). FIG. 1A is a diagram showing a linear relation (106) between current and voltage. A standard resistor is a type of device which has a linear relationship between current and voltage. The change in voltage per change in current is generally the same across all voltage levels. Thus there is a direct relationship between current and voltage.

Figure 1B:
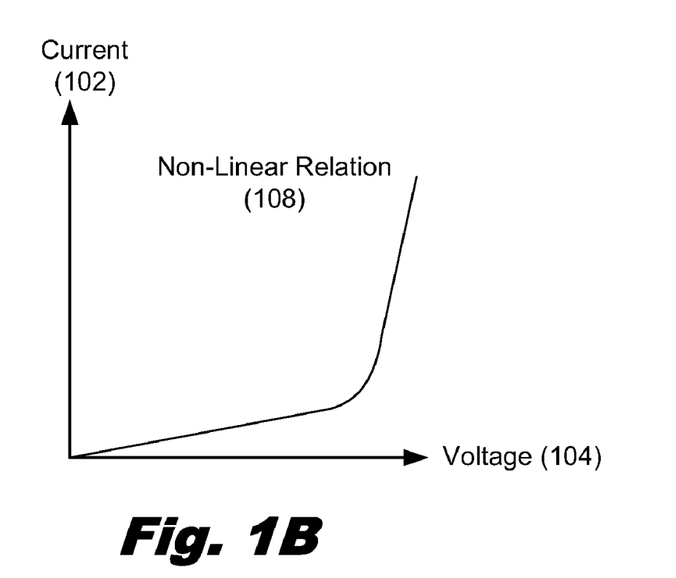

FIG. 1B is a diagram showing a non-linear relation (108) between current and voltage. A standard diode is one type of device which has a non-linear relation (108) between current and voltage. In general, the greater the current flowing through the diode, the greater the voltage drop across the applied to the diode. However, the change in current per change in voltage varies at different current levels. Thus, there is not a proportional relationship between current and voltage.

Figure 1C:
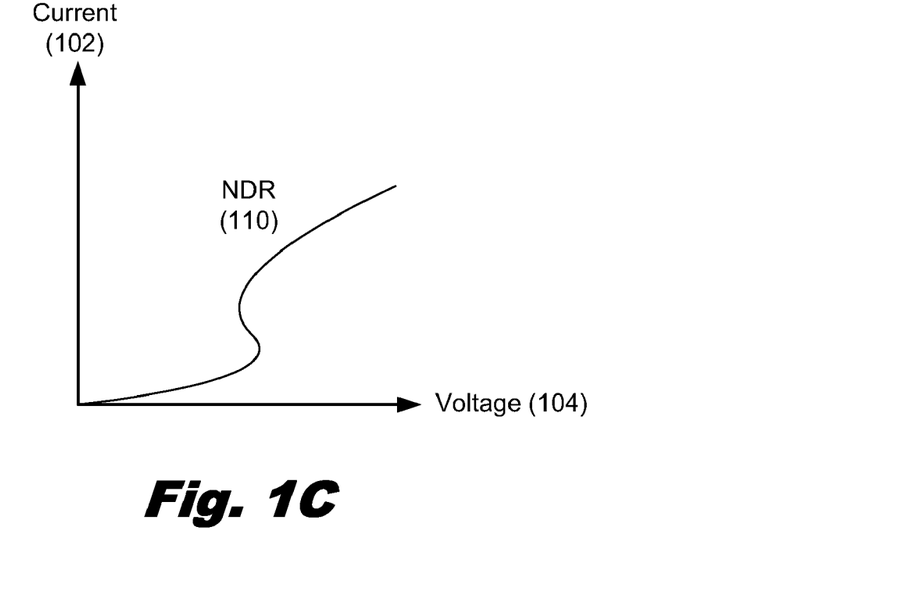

FIG. 1C is a diagram of a non-linear relationship which exhibits NDR (110). As mentioned above, some devices exhibit a property referred to as NDR (110). A device which exhibits NDR will experience a decrease in voltage at certain levels of increasing current. This creates an 'S' shaped curve in the current-to-voltage relationship as illustrated in FIG. 1C.

Figure 1D:
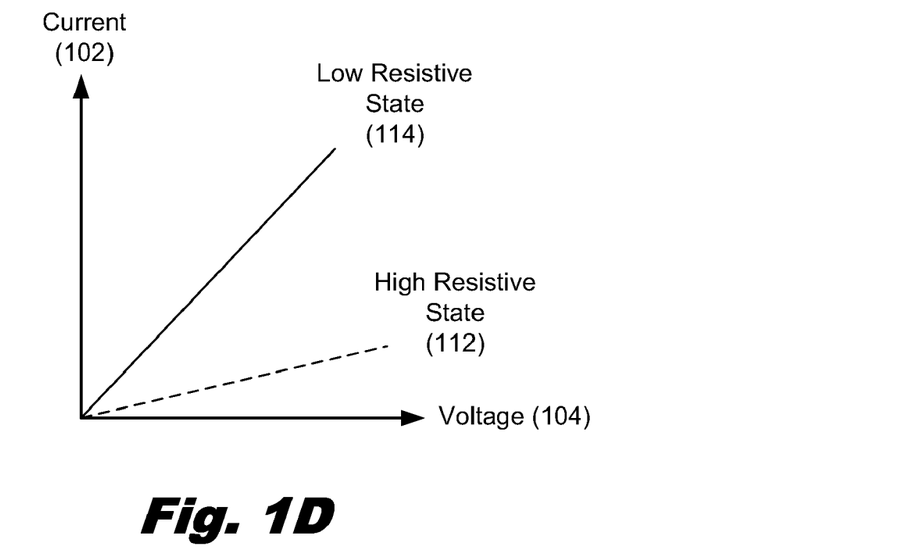

FIG. 1D is a diagram showing a current-to-voltage relationship of a memristive device. As will be described in more detail below, memristive devices can change the state of their resistance based on an applied programming voltage. At low bias levels and in a high resistive state (112), a particular change in current causes a relatively large change in voltage. Conversely, in a low resistive state (114), the same change in current causes a relatively small change in voltage. The relationship between current and voltage in a memristive device at low bias levels (e.g. less than 200 mV) is generally linear.

Figure 2A:
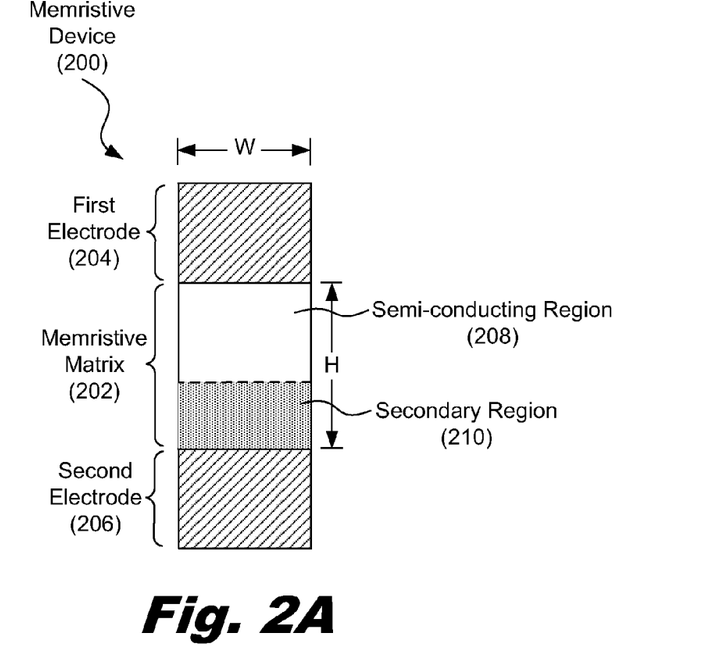
FIGS. 2A-2D are diagrams illustrating the operation of a memristive device, according to one example of principles described herein.

FIG. 2A is diagram showing an illustrative memristive device with no electrical conditions being applied. According to one illustrative example, the memristive device includes a first electrode (204) and a second electrode (206) in electrical and physical contact with a memristive matrix (202). The memristive matrix (202) is initially comprised of two separate regions: a semiconducting region (208) which is not intentionally doped and a highly doped secondary region (210).

Throughout the specification and appended claims, the term "memristive matrix" describes a thin film of material that is electronically semiconducting or nominally electronically insulating and also a weakly ionic conductor. The memristive matrix is capable of transporting and hosting ions that act as dopants to control the flow of electrons through the memristive device (200). The basic mode of operation is to apply an electrical field (the drift field, which may exceed a threshold for enabling the motion of the ions in the memristive matrix) across the memristive device. The electrical field is large enough to cause an ionic species to be transported within the memristive matrix via ionic transport. The ionic species are specifically chosen from those that act as electrical dopants for the memristive matrix, and thereby change the electrical conductivity of the matrix from a high resistive state to a low resistive state. Furthermore, the memristive matrix and the dopant species are chosen such that the drift of the dopants within the memristive matrix is possible but not too facile. This ensures that the memristive device remains in whatever state it is set for a reasonably long time, perhaps many years at room temperature. Thus, the memristive device (200) is nonvolatile. A nonvolatile device is one which holds its state with or without receiving power.

The matrix material (202) may be a thin film (generally less than 200 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage.

Conduction of electrons through the matrix material (202) is frequently dominated by quantum mechanical tunneling of the electrons. When a semiconducting matrix material is essentially intrinsic at a junction with an electrode, the tunneling barrier is high and wide, causing the memristive device to be in a high resistive state. When a significant number of dopant species have been injected into or distributed throughout the semiconductor, the width and perhaps the height of the tunneling barrier are diminished by the potential of the charged species. This results in an increase of the conductivity of the switch, placing the memristive device (200) in a low resistive state.

FIG. 2A illustrates one potential "as manufactured" state of the memristive device (200). The semiconducting region (208) has very few dopants and prevents electrical current from flowing between the two electrodes (204, 206). The secondary region (210) is conductive and serves as a source of dopants which can be moved into the semiconducting region (208) to change the overall electrical conductivity of the memristive matrix (202). Consequently, in the "as manufactured" state of the memristive device illustrated in FIG. 2A, the memristive device (200) is a high resistive state.

The electrodes (204, 206) may be constructed from a variety of conducting materials, including but not limited to: metals, metal alloys, metal composite materials, nanostructured metal materials, or other suitable conducting materials.

The memristive matrix (202) has a height of "H" and a width of "W" as shown in FIG. 2A. For purposes of illustration only, assume that the height "H" is 100 nanometers and the width "W" is approximately 50 nanometers. As discussed above, a relatively intense electrical field can be generated across the thin film of memristive matrix by a relatively small voltage. For example, a dopant may require an electrical field intensity of 100,000 volts per centimeter to move within the matrix. If the distance between two electrodes is 100 nanometers, a voltage bias of only 1 Volt applied across the first electrode (204) and the second electrode (206) will produce the required electrical field intensity of 100,000 volts/centimeter through the memristive material (202). The application of a programming voltage above a certain threshold allows the dopants to be moved through the memristive matrix (202).

Figure 2B:
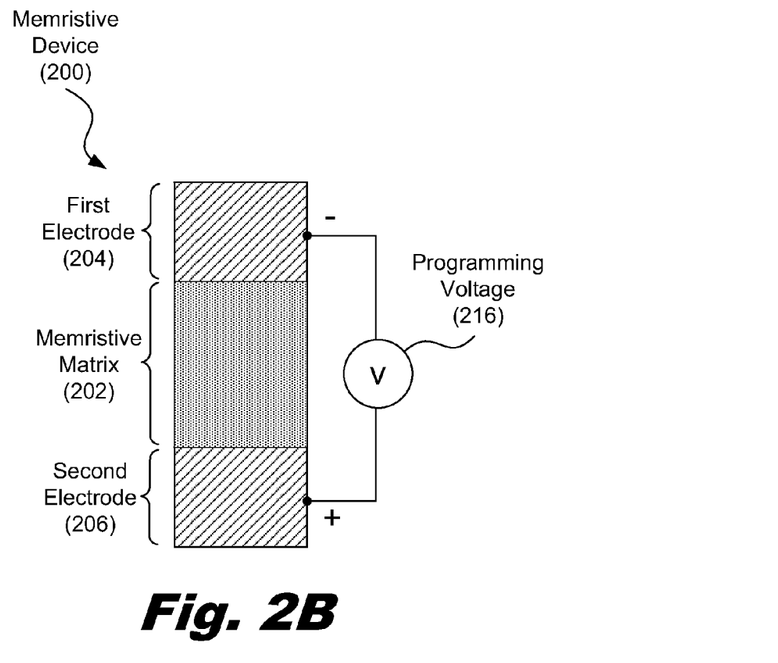

FIG. 2B is a diagram showing the memristive device (200) with a programming voltage (216) applied. The programming voltage (216) results in an electrical field which facilitates not only the movement of dopants from the highly doped region (210) into the intrinsic region (208) but also the creation of some native dopants, such as oxygen vacancies, via an electro-reduction process in oxide memristive materials. The polarity and voltage difference which is applied across the memristive matrix (202) varies according to a variety of factors including, but not limited to: material properties, geometry, dopant species, temperature, and other factors. For example, when the ions are positively charged, the ions are repelled by positive voltage potentials and attracted to negative voltage potentials. For example, a positive voltage may be applied to the second electrode (206) and negative voltage may be applied to the first electrode (204).

According to one illustrative example, the initial application of a programming voltage (216) to the memristive device (200) is used to form the junction and define its characteristics. This initial programming voltage (216) may be higher than other applied voltages used for operational purposes. The initial programming voltage (216) may serve a number of functions which prepare the junction for further use. For example, the programming voltage (216) may result in the initial creation of additional mobile dopants or the migration of the mobile dopants into more active regions of the memristive matrix (202), which reduces the effective thickness of the switching layer and causes an increased electric field with the same applied voltage. In addition, the electric field for dopant drift in the switching process is usually lower than that for dopant creation in the electroforming process. Consequently, lower programming voltages (216) can be subsequently used to move the dopants after electroforming.

Figure 2C:
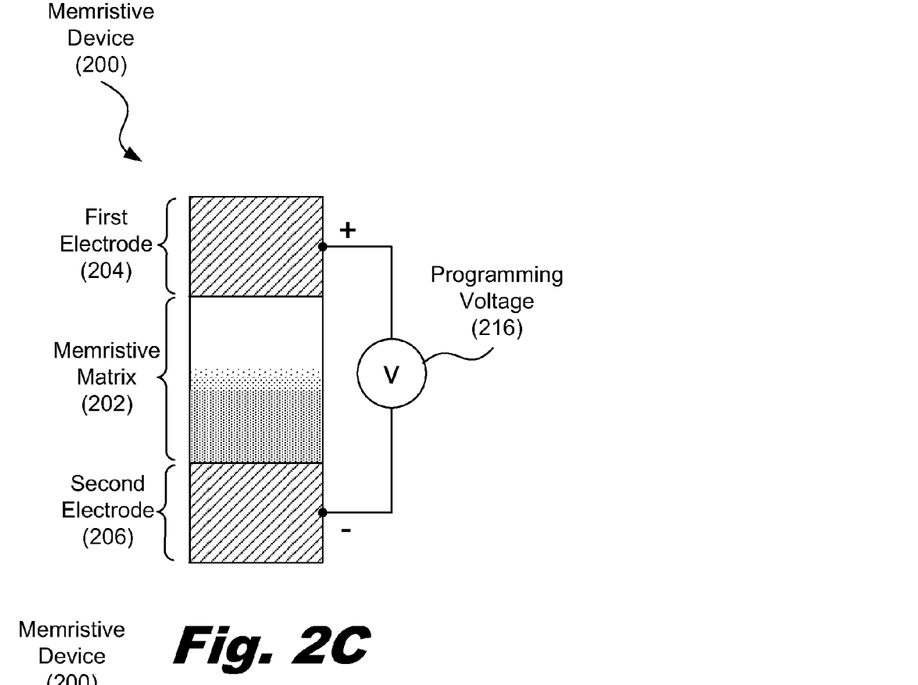
Figure 2D:
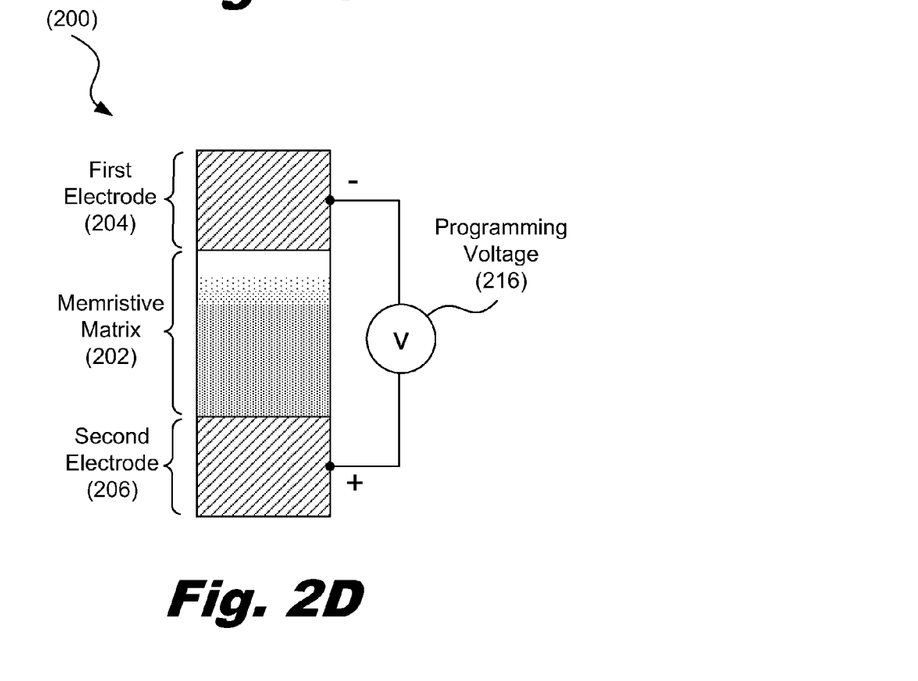

FIGS. 2C and 2D illustrate the normal switching operation of a memristive device (200) after the forming voltage has been applied. FIG. 2C illustrates the application of a subsequent programming voltage V which has the opposite polarity of the forming voltage applied in FIG. 2B. This programming voltage V applies a positive voltage to the upper electrode and a negative voltage to the lower electrode. In the current example, the mobile dopant species are assumed to be positively charged. Consequently, these positively charged dopants migrate away from the upper electrode under the influence of the resulting electrical field and the junction is placed in a nonconductive or OFF state.

FIG. 2D illustrates the application of a subsequent programming voltage to the memristive junction (200) to return the junction to the ON state. Consequently, the applied programming voltage has the opposite polarity from the voltage illustrated in FIG. 2C. The mobile dopants move within the electrical field toward the upper electrode and reduce the electrical resistance of the memristive device (200). The overall electrical resistance may be influenced by a variety of factors, including, but not limited to the geometry of the memristive matrix and the electrodes, the dopant concentration, the distribution of the dopants throughout the memristive matrix, the species of dopant, the electrical characteristics of the matrix material, the temperature of the device, and other factors.

The transition from the fully "OFF" to fully "ON" configuration or vice versa, is not instantaneous, but can have a number of intermediate states in which the memristive matrix acts as a finite resistance between the two electrodes. These intermediate states may be produced by varying the programming voltage applied across the two electrodes (204, 206) and/or varying the time period during which the programming voltage is applied.

The materials used to form the memristive matrix device may also exhibit NDR under certain conditions. Particularly, at cryogenic temperatures, the metal oxides which can be used to form the secondary region (210) can exhibit a Metal-Insulator Transition (MIT) which can be initiated by the application of a current to the device. This occurs when electric current injected between two electrodes connected to the MIT material locally heats the MIT material above a transition temperature. The transition temperature is the temperature at which a solid material changes from one crystal state to another. This rise above the transition temperature causes current filamentation to occur. Current filamentation is an inhomogeneity in the current density distribution orthogonal to the direction of current flow. This current filamentation leads to negative differential resistance.

Figure 3A:
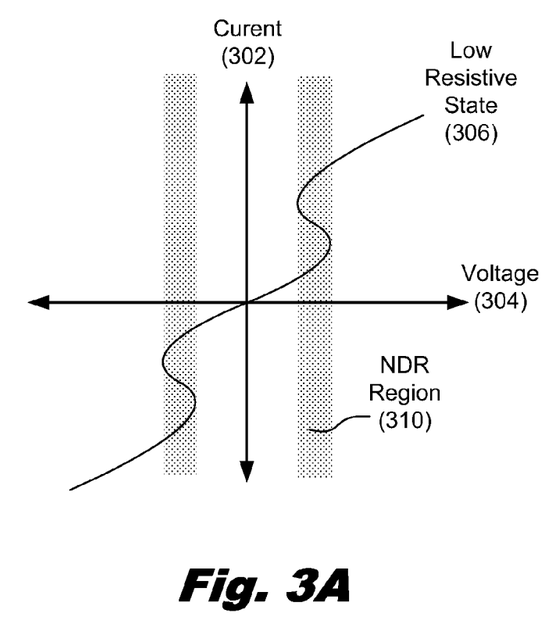
FIGS. 3A-3B are diagrams showing illustrative current-to-voltage relationship of a memristive NDR device, according to one example of principles described herein.
Figure 3B:
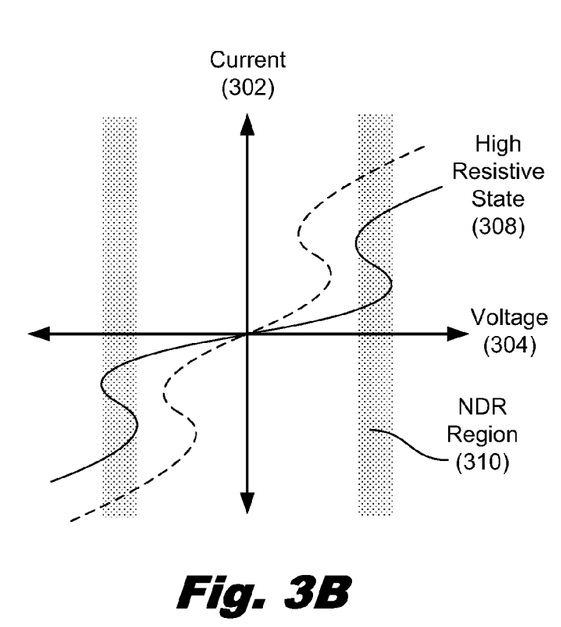

FIGS. 3A-3B are diagrams showing illustrative current-to-voltage relationship of a memristive device which also exhibits NDR. This device will be referred to as a memristive NDR device. The vertical axes of the graphs in FIGS. 3A and 3B represent electric current (302) and the horizontal axes of the graphs represent voltage (304). The type of NDR which will be described is referred to as current controlled NDR.

FIG. 3A shows a diagram of the 'S' curve for a memristive device in a low resistive state (306). In general, an increase in current across the memristive NDR device creates an increase in voltage across the memristive NDR device. However, at certain regions of applied electric current, an increase in current leads to a decrease in voltage. The regions where this negative differential resistance occurs will be referred to as the NDR region (310) of the memristive NDR device. The NDR region (310) corresponds to the range of bias voltage levels which produce a current through the memristive NDR device which will create an oscillating signal. The manner in which the oscillating signal is created will be discussed in greater detail below in the text accompanying FIG. 4.

FIG. 3B is a diagram showing the 'S' curve for a memristive NDR device in a high resistive state (308). As mentioned above, a programming voltage can be applied to a memristive NDR device to change the resistive state of the memristive NDR device. Changing the resistive state also changes the shape of the 'S' curve. With the change in the 'S' curve, the NDR region (310) is at a different range of electric current levels. The different range of current levels allows an oscillating signal having different properties to be produced.

Figure 4A:
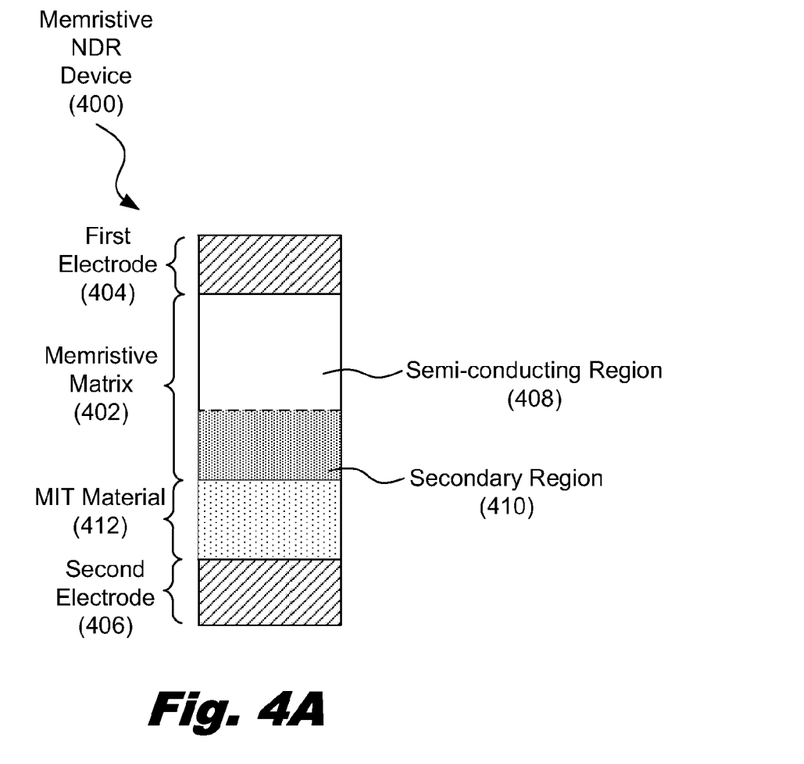
FIG. 4A is a diagram showing an illustrative memristive NDR device, according to one example of principles described herein.

FIG. 4A is a diagram showing an illustrative memristive NDR device (400). As mentioned above, the materials used to form a memristive matrix can exhibit NDR. However, such materials do not provide accurate control over the NDR characteristics. Additionally, NDR is typically exhibited at cryogenic temperatures. In light of this issue, the present specification discloses a memristive device which is able to exhibit NDR at room temperatures.

According to certain illustrative embodiments, the memristive NDR device (400) includes a memristive matrix (402) adjacent to a first electrode (404). The memristive matrix (402) includes a semi-conducting region (408) and a secondary region (410). The memristive matrix (402) operates as described above in the text accompanying FIGS. 2A-2D. The memristive matrix (402) is adjacent and in series with a Metal-Insulator Transition (MIT) material (412). The MIT material (412) is adjacent to a second electrode (406).

The MIT material may include a variety of metal oxides including, but not limited to, vanadium oxide materials, iron oxide materials, niobium oxide materials, titanium oxide materials, and manganese oxide materials.

As mentioned above, an MIT material (412) can exhibit NDR with the application of a current to the MIT material (412). The NDR occurs when electric current injected between two electrodes connected to the MIT material (412) locally heats the MIT material (412) above a transition temperature. The transition temperature is the temperature at which a solid material changes from one crystal state to another. This rise above the transition temperature causes current filamentation to occur. Current filamentation is an inhomogeneity in the current density distribution orthogonal to the direction of current flow. This current filamentation is what causes the NDR.

Figure 4B:
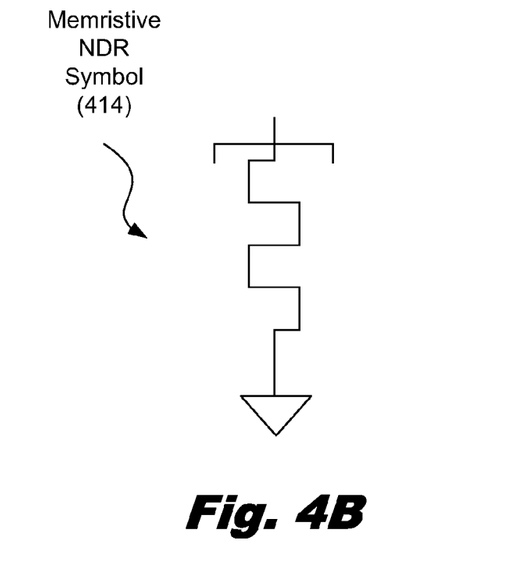
FIG. 4B is a diagram showing an illustrative schematic symbol for a memristive NDR device, according to one example of principles described herein.

FIG. 4B is a diagram showing an illustrative schematic symbol (414) for a memristive NDR device (400). The symbol (414) illustrated in FIG. 4B represents a memristive NDR device (400) embodying principles described herein. Particularly, the symbol (414) represents a two-terminal device which represents both memristance and NDR.

Figure 5:
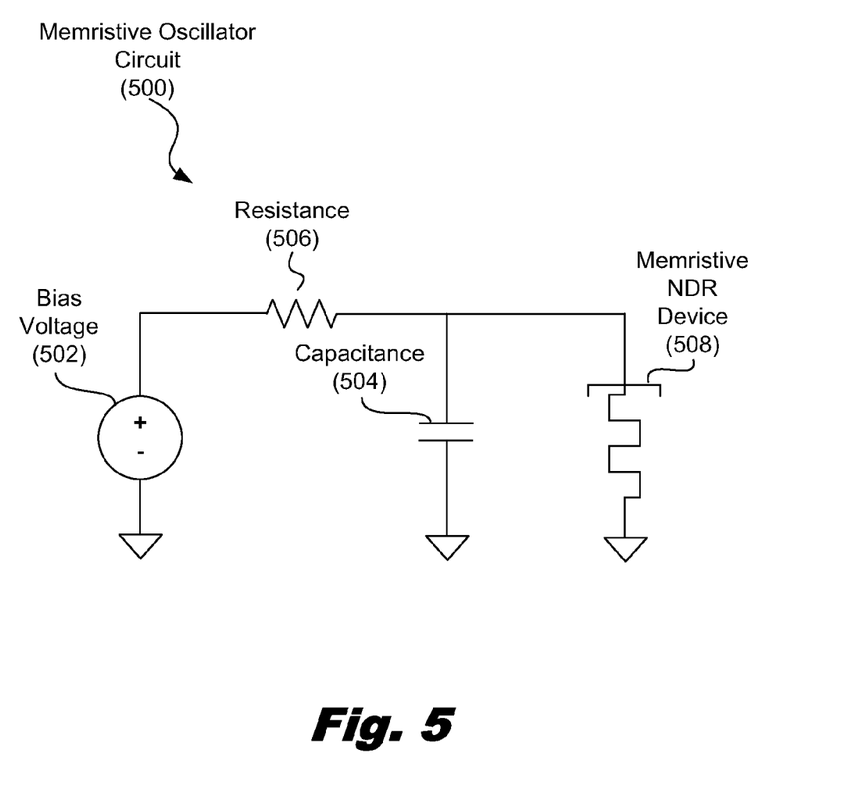
FIG. 5 is a diagram showing an illustrative memristive oscillator circuit, according to one example of principles described herein.

FIG. 5 is a diagram showing an illustrative memristive oscillator circuit (500). According to certain illustrative examples, the oscillator circuit includes a bias voltage supply (502), a capacitance (504), a resistance (506), and a memristive NDR device (508). The following describes the manner in which an oscillating signal is produced.

When a bias voltage is applied to the memristive oscillator circuit (502), that bias voltage will be divided between the resistance (506) and the memristive NDR device (508). The same voltage applied across the memristive NDR device (508) will be coupled across the capacitance (504). It will take a certain amount of time for voltage across the capacitance (504) to reach its full voltage level resulting from the applied bias voltage (502). After the capacitance (504) charges to a particular voltage level, the current flowing through the memristive NDR device (508) will fall within the NDR region (e.g. 310, FIG. 3) of the memristive NDR device (508). Due to the negative resistance, the memristive NDR device (508) will experience a decrease in voltage rather than an increase in voltage with the rising current level. This will cause the capacitance (504) to begin to discharge.

After the capacitance has discharged below a certain level, the current flowing through the memristive NDR device (508) will fall outside of the NDR region of the memristive NDR device (508). When this happens, the voltage will once again increase with increasing current levels. This will cause the capacitance to begin charging again. The continual charging and discharging of the capacitance (504) causes an oscillating voltage signal across the capacitance (504). The nature of this oscillating signal will be discussed below in the text accompanying FIG. 5.

The capacitance (504) may be either a parasitic capacitance or a capacitive device. Parasitic capacitance is an unavoidable capacitance that exists between components in an electrical circuit. The oscillator circuit can be designed to use this parasitic capacitance for the circuit. In some cases, the oscillator circuit can include a capacitive component. A capacitive component, such as a capacitor, is a device which is designed to have a specific capacitance. The capacitive component can be used to reach a target capacitance. The target capacitance can be based on the design goals of the oscillator circuit. For example, the value of the capacitance will affect the time it takes for a capacitor to charge or discharge. Thus, by designing the circuit with a specific capacitance (504), a specific frequency range of oscillating signals can be produced.

Figure 6:
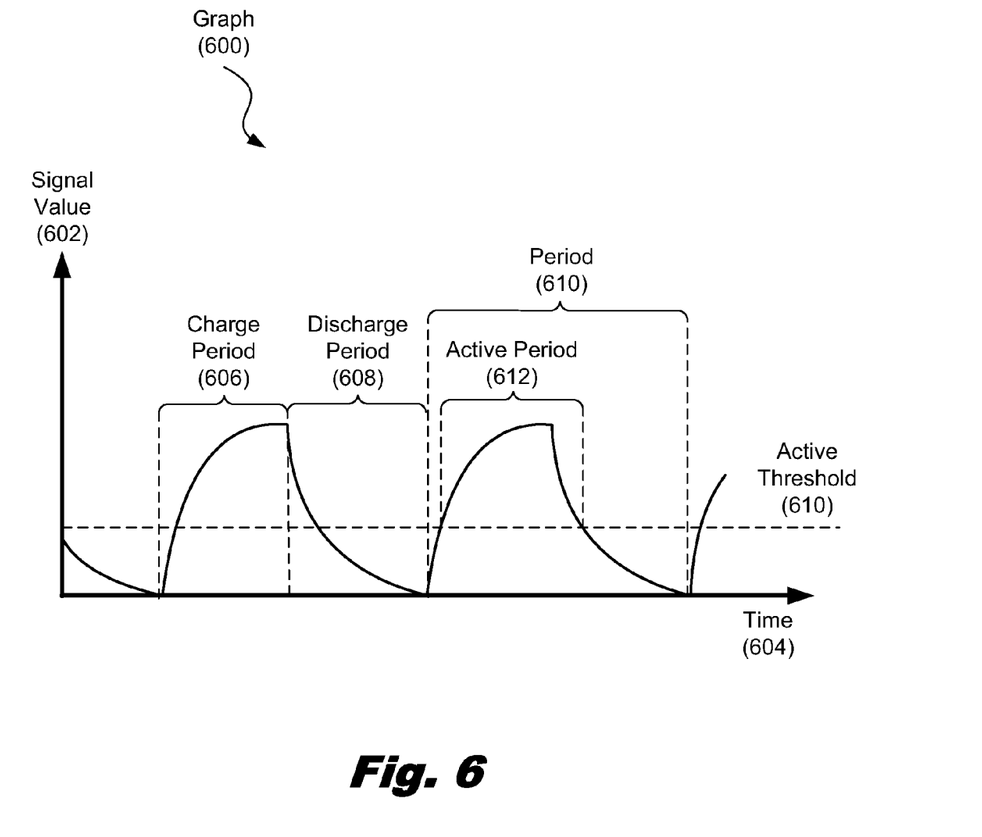
FIG. 6 is a diagram showing a graph illustrating an oscillating signal, according to one example of principles described herein.

FIG. 6 is a diagram showing an illustrative graph (600) of an oscillating signal. The vertical axis of the graph (600) represents a signal value (602). This signal value can be in terms of either voltage or current. The horizontal axis of the graph (600) represents time (604). As mentioned above, the application of a bias voltage to a memristive oscillator circuit (e.g. 400, FIG. 4) produces an oscillating signal. This signal is generally periodic in nature. A periodic signal is one which repeats itself in regular periods of time.

As mentioned above, the oscillating signal is produced as a result of the charging and discharging of a capacitance. At the start of the charge period (606), the voltage level of the capacitance and the memristive device is outside the NDR region. Thus, the current flowing through the memristive device increases as the capacitor voltage increases. As the voltage across the capacitance increases past a certain point, the voltage level across the capacitance and the memristive device falls within the NDR region. This point is the start of the discharge period (608). At this point the electric current flowing through the memristive device instantaneously increases and subsequently will begin to decrease as the capacitor voltage decreases. This causes the capacitance to begin discharging. In the simple circuit of FIG. 4 the charging and discharging transient of the capacitor is similar to an exponential function in time. Additionally, components including filters may be used to modify the output profile of the oscillator circuit.

The continual charging and discharging of the capacitance produces an oscillating signal. The frequency of the oscillating signal is dependent upon a time constant of the oscillator circuit. The time constant is affected by the value of the capacitance and certain resistances within the circuit. Changing the resistive state of the memristive device changes the time constant of the oscillator circuit. This affects the frequency at which a signal will oscillate as well as other characteristics of the signal such as duty cycle and amplitude.

The duty cycle of a periodic signal is defined as the ratio of time a signal is in an active state to a total period (610) of the signal. The period (610) of a signal is the amount of time it takes for a point of the signal to reach the same point in the next repetition of the period signal. For example, the time between the start of the charge period (606) for one repetition and the start of the charge period (606) for the next repetition can be used to define the period (610).

The time in which a signal is in an active state is referred to as the active period (612). An active state can be defined as a signal value above an arbitrarily set active threshold (610). Any signal value above the active threshold (610) indicates the signal is in an active state and any signal value below the active threshold indicates the signal is in an inactive state. The duty cycle is thus the ratio of the active period (612) to the period (610).

The resistive state of the memristive device of the oscillator circuit can be programmed to cause the oscillating signal to exhibit a target duty cycle. For example, an oscillating signal with one duty cycle can be produced while the memristive device of the oscillator circuit is in one resistive state, and an oscillating signal with a different duty cycle can be produced while the memristive device is in a different resistive state. This can be beneficial in the case where an electronic device utilizing a memristive oscillator circuit makes use of two different oscillating signals, each with a different duty cycles. A memristive oscillator circuit embodying principles described herein can be designed to produce both types of oscillating signals. This may be done with a single compact oscillator circuit rather than two separate oscillator circuits.

The signal illustrated in FIG. 6 is one example of a signal which can be produced by an oscillator circuit embodying principles described herein. In some cases, a memristive oscillator circuit can produce a non-periodic signal. A non-period signal is one which has a random element. Such signals may be used for a variety of applications such as encryption devices.

Figure 7:
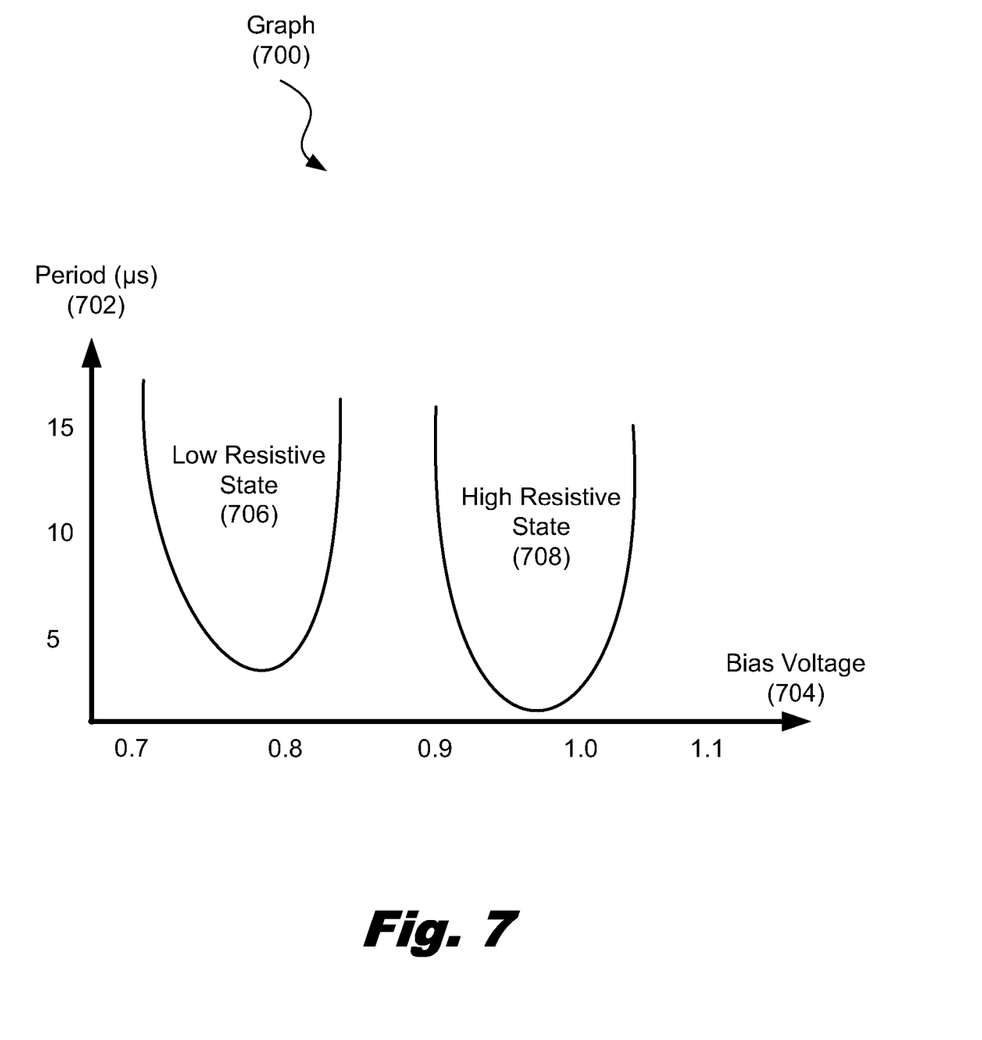
FIG. 7 is a diagram showing an illustrative graph of applied voltage to period for different memristive states, according to one example of principles described herein.

FIG. 7 is a diagram showing an illustrative graph of applied voltage to signal period for different memristive states. According to certain illustrative examples, the relation between applied bias voltage and frequency of oscillation can be changed by changing the resistive state of the memristive device of an oscillator circuit. The horizontal axis of the graph (700) represents the bias voltage (704) in volts and the vertical axis of the graph (700) represents the time period (702) in microseconds. The time period is the inverse of frequency. For example, a time period of 5 microseconds corresponds to a frequency of 200 kilohertz (kHz).

The graph illustrates two 'U' shaped lines. Each 'U' shaped line represents the relation between the applied bias voltage and time period of the oscillating signal for a resistive state of the memristive device of the oscillator circuit. The 'U' shaped line on the left illustrates the relation between applied bias voltage and signal period for a low resistive state (706). At this low resistive state, as the bias voltage approaches a value of slightly less than 0.8 volts, the time period for the signal approaches slightly less than 5 microseconds. As the bias voltage passes 0.8 volts, the time period rapidly increases. No oscillations will be observed outside of a range of voltages applied to the circuit. The high and low cutoff voltages that define this range correspond respectively to the right and left edges of the 'U' curve.

The 'U' shaped line on the right illustrates the relation between applied bias voltage and signal period for a high resistive state (708). By changing the resistive state of the memristive device of the oscillating circuit, the range of applied bias voltages which will produce an oscillating signal changes. At this high resistive state, as the bias voltage approaches a value of slightly less than 1 volt, the time period for the signal approaches 1 microsecond. Thus, the high resistive state is capable of reaching a higher frequency.

FIG. 7 illustrates the relationship between applied bias voltage (704) and period (702) for only two resistive states. However, a memristive device can be set to a continuum of resistive states between the high resistive state and the low resistive state. Each state of the memristive device will exhibit its own relationship between applied bias voltage (704) and signal period (702). The state of the memristive device can be programmed to cause an oscillator circuit to produce an oscillating signal at a target period and thus a target frequency. Thus, a single oscillator circuit can be tuned to meet the changing needs of an electronic device utilizing the oscillator circuit.

The relationships between applied bias voltage (704) and period (702) shown in FIG. 7 are used for illustrative purposes and are not necessarily representative of such relationships exhibited by a practical oscillator circuit.

Figure 8:
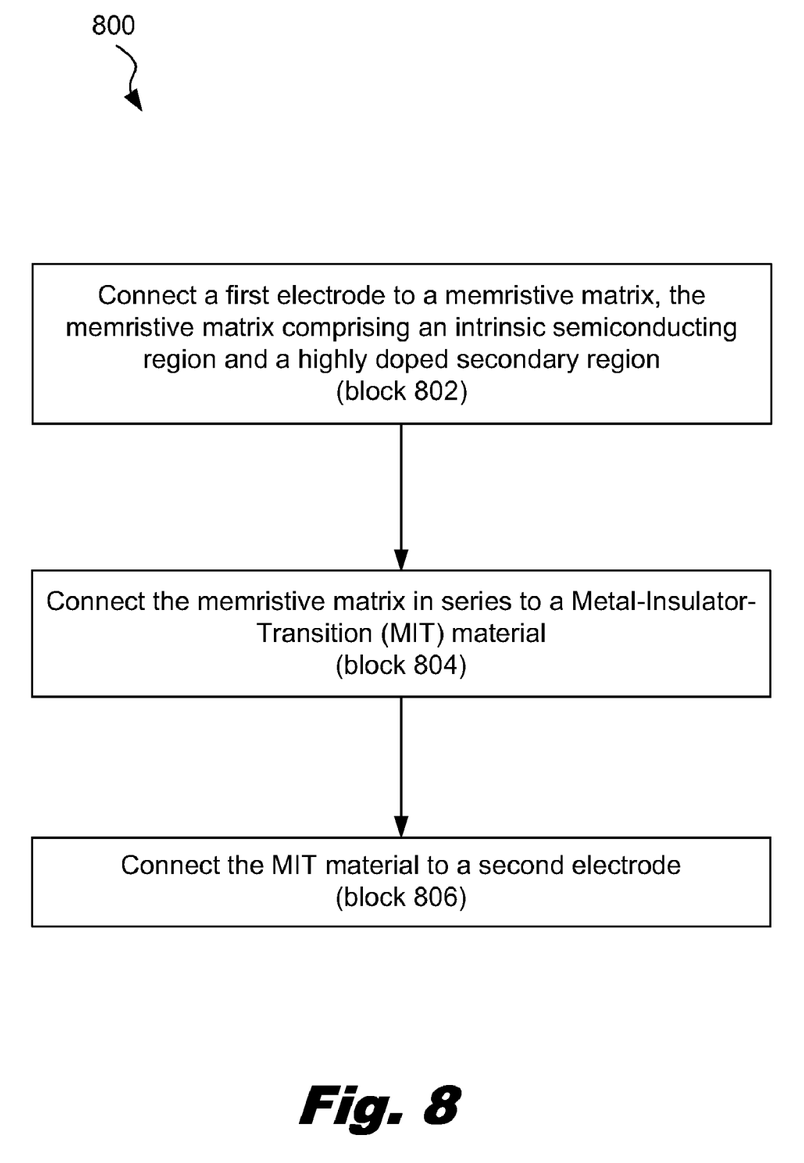
FIG. 8 is a flowchart showing an illustrative method (800) for fabricating a memristive NDR device, according to one example of principles described herein.

FIG. 8 is a flowchart showing an illustrative method (800) for fabricating a memristive Negative Differential Resistance (NDR) device. According to certain illustrative examples, the method includes connecting (block 802) a first electrode to a memristive matrix, the memristive matrix including an intrinsic semiconducting region and a highly doped secondary region; connecting (block 804) the memristive matrix in series to a Metal-Insulator-Transition (MIT) material; and connecting (block 806) the MIT material to a second electrode.

In conclusion, through use of a memristive oscillator circuit embodying principles described herein, a reconfigurable oscillator circuit is realized. This allows a single compact oscillator circuit to produce an oscillating signal with a variety of characteristics. The different characteristics of the oscillating signal are achieved by simply programming the memristive device of the oscillator circuit to a different memristive state. This allows the oscillator circuit to produce an oscillating signal that is able to change based on the needs of an electronic device utilizing the oscillating circuit. Additionally, memristive memristive devices may be manufactured to be very small. For example, a memristive device may consume only a 50 nm×50 nm space on an integrated circuit.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A circuit comprising a memristive Negative Differential Resistance (NDR) device comprising:
    a first electrode adjacent to a memristive matrix, said memristive matrix comprising an intrinsic semiconducting region and a highly doped secondary region;
    a Metal-Insulator-Transition (MIT) material in series with said memristive matrix; and
    a second electrode adjacent to said MIT material.

2. The circuit of claim 1, in which said MIT material comprises at least one of: a vanadium oxide material, a niobium oxide material, an iron oxide material, a manganese oxide material, and a titanium oxide material.

3. The circuit of claim 1, in which one of: said first electrode and said second electrode is connected to:
    a capacitance in parallel with said memristive NDR device; and
    a bias voltage supply to apply a bias voltage to said memristive NDR device such that an oscillating signal is produced.

4. The circuit of claim 3, in which one of said first electrode and said second electrode is connected to a programming voltage supply to change a resistive state of said memristive NDR device by applying a programming voltage to move an interface between said semiconducting region and said highly doped semiconducting region.

5. The circuit of claim 4, in which a programming voltage from said programming voltage supply changes said resistive state to cause said signal to stop oscillating.

6. The circuit of claim 4, in which a programming voltage from said programming voltage supply changes said resistive state to cause said signal to start oscillating.

7. The circuit of claim 4, in which a programming voltage from said programming voltage supply changes said resistive state to cause said oscillating signal to exhibit a target duty cycle.

8. The circuit of claim 4, in which a programming voltage from said programming voltage supply changes said resistive state to cause said signal to exhibit a target oscillating frequency.

9. The circuit of claim 4, in which a programming voltage from said programming voltage supply changes said resistive state to cause said signal to exhibit a target amplitude.

10. The circuit of claim 4, in which said capacitance is one of: a parasitic capacitance and a capacitive device.

11. The circuit of claim 1, further comprising, a programming voltage supply to change a resistive state of said memristive device.

12. The circuit of claim 11, in which a programming voltage from said programming voltage supply changes said resistive state to cause said signal to stop oscillating.

13. The circuit of claim 11, in which a programming voltage from said programming voltage supply changes said resistive state to cause said signal to start oscillating.

14. The circuit of claim 11, in which a programming voltage from said programming voltage supply changes said resistive state to cause said oscillating signal to exhibit a target duty cycle.

15. The circuit of claim 11, in which a programming voltage from said programming voltage supply changes said resistive state to cause said signal to exhibit a target oscillating frequency.

16. The circuit of claim 11, in which a programming voltage from said programming voltage supply changes said resistive state to cause said signal to exhibit a target amplitude.

* * * * *